(12) United States Patent
Wuidart et al.

(10) Patent No.: US 6,882,699 B2
(45) Date of Patent: Apr. 19, 2005

(54) MONOTONIC UP-COUNTER IN AN INTEGRATED CIRCUIT

(75) Inventors: Luc Wuidart, Pourrieres (FR); Claude Anguille, Aix en Provence (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/694,211

(22) Filed: Oct. 27, 2003

(65) Prior Publication Data

US 2004/0086073 A1 May 6, 2004

(30) Foreign Application Priority Data

Oct. 28, 2002 (FR) .............................................. 02 13457

(51) Int. Cl.⁷ .............................................. H03K 23/66
(52) U.S. Cl. ..................... 377/52; 377/116; 377/117; 257/529; 257/538
(58) Field of Search .......................... 377/52, 116, 117; 257/529, 538

(56) References Cited

U.S. PATENT DOCUMENTS

| | | |
|---|---|---|
| 4,146,902 A | 3/1979 | Tanimoto et al. |
| 4,399,372 A | 8/1983 | Tanimoto et al. |
| 4,559,637 A | 12/1985 | Weber |
| 4,586,163 A | 4/1986 | Koike |
| 5,187,559 A | 2/1993 | Isobe et al. |
| 5,357,451 A * | 10/1994 | Beaudry et al. ............... 702/88 |
| 5,418,738 A | 5/1995 | Abadeer et al. |
| 5,872,772 A * | 2/1999 | Mizuno et al. ............. 370/254 |
| 6,433,725 B1 | 8/2002 | Chen et al. |
| 2002/0027793 A1 | 3/2002 | Johnson et al. |

FOREIGN PATENT DOCUMENTS

DE    101 01 575 A1    7/2002

\* cited by examiner

*Primary Examiner*—Margaret R. Wambach
(74) *Attorney, Agent, or Firm*—Lisa K. Jorgenson; James H. Morris; Wolf, Greenfield & Sacks, P.C.

(57) ABSTRACT

An increasing monotonic counter over n bits formed as an integrated circuit, including an assembly of $2^{n+1}-(n+2)$ irreversible counting cells distributed in at least n groups of $2^p-1$ counting cells, where p designates the group rank, and at least n−1 parity calculators, each calculator providing a bit of rank p, increasing from the most significant bit of the result count, taking into account the states of the cells of the group of same rank.

7 Claims, 3 Drawing Sheets

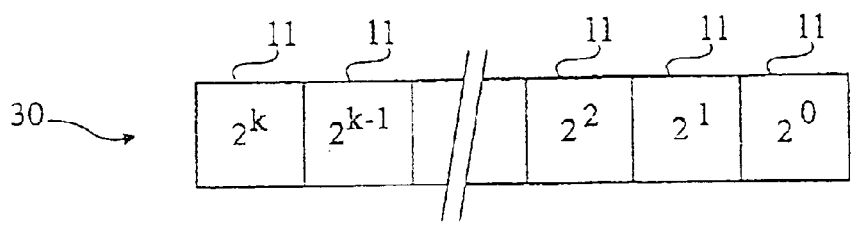
Fig 6
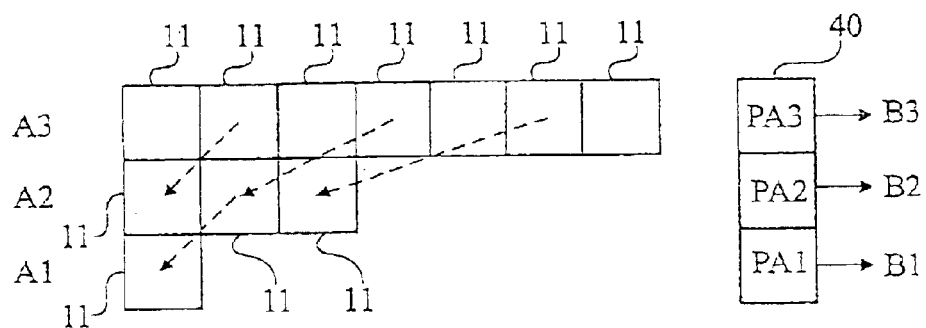
Fig 7
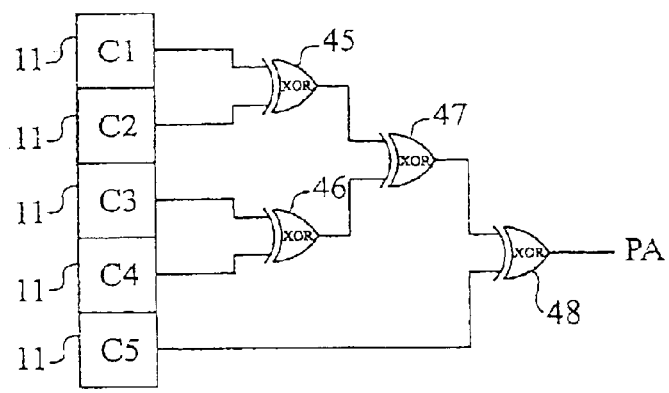
Fig 8
Fig 9

MONOTONIC UP-COUNTER IN AN INTEGRATED CIRCUIT

BACKGROUND OF THE INVENTION

1. Field of the Invention

The present invention relates to the field of integrated circuit counters. The present invention more specifically relates to the forming of an irreversibly monotonic up-counter.

2. Discussion of the Related Art

Currently, to form monotonic up-counters, fuse elements have to be used, which have the major disadvantage of causing a destructive programming often incompatible with a programming during operation of the integrated circuit containing the fuse element. Another example relates to EPROM or EEPROM memories, the manufacturing of which requires steps not directly compatible with a CMOS technology.

Further, in both cases, the achieved programming state is either erasable (case of EEPROMs) or optically visible, which is prejudicial in security-type applications for which an inviolable count is desired to be available.

An example of application consists of counting the number of events with respect to a limiting event threshold (number of uses of a program or duration of use). In this type of application, it is generally desired to have a counter, each bit of which respectively takes states 0 or 1 in irreversible fashion to provide a binary word representative of the number of events having occurred.

SUMMARY OF THE INVENTION

The present invention aims at providing a one-time programming monotonic counter which overcomes the disadvantages of known solutions.

The present invention especially aims at providing such an irreversible counter which, in the programmed state, is optically undetectable and which is compatible with an integrated circuit manufacturing CMOS technology.

The present invention also aims at providing a monotonic increasing counter, the programming and the operation of which are compatible with applications requiring a linear counting.

To achieve these and other objects, the present invention provides an increasing monotonic counter over n bits formed as an integrated circuit, comprising:

an assembly of $2^{n+1}-(n+2)$ irreversible counting cells distributed in at least n groups of $2^p-1$ counting cells, where p designates the group rank; and at least n−1 parity calculators, each calculator providing a bit of rank p, increasing from the most significant bit of the result count, taking into account the states of the cells of the group of same rank.

According to an embodiment of the present invention, the most significant bit is directly provided by the single cell of the group of rank 1.

According to an embodiment of the present invention, the circuit comprises n calculators, the most significant bit being provided by the calculator taking into account the state of the single counting cell of the group of rank 1.

According to an embodiment of the present invention, each counting cell is formed of a one-time programming memory cell, a storage element of which is formed of at least one polysilicon resistor, programmable by irreversible decrease in its value. The present invention also provides a method for controlling a counter, comprising causing a programming of a counting cell of a group of lower rank each time the parity controller of a group of immediately higher rank detects a parity.

According to an embodiment of the present invention, a state machine in wired logic is used.

According to an embodiment of the present invention, a microcontroller is used.

The foregoing objects, features and advantages of the present invention, will be discussed in detail in the following non-limiting description of specific embodiments in connection with the accompanying drawings.

BRIEF DESCRIPTION OF THE DRAWINGS

FIG. 6 very schematically shows in the form of blocks a counter formed from counting cells with a polysilicon resistor;

FIG. 7 shows an embodiment of an increasing monotonic counter according to the present invention;

FIG. 8 illustrates, in a table, the respective states taken by the outputs of the counter over three bits of FIG. 7; and FIG. 9 shows an embodiment of a parity counter, applied to a four-bit counter according to the present invention.

DETAILED DESCRIPTION

Figure 1:
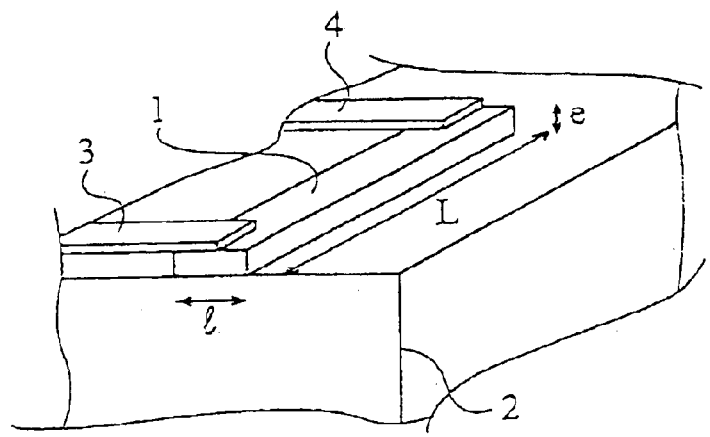
FIG. 1 illustrates, in a partial perspective view, an embodiment of a polysilicon resistor forming the storage element of a counting cell according to the present invention.

The same elements have been designated with the same reference numerals in the different drawings. For clarity, only those elements that are necessary to the understanding of the present invention have been shown in the drawings and will be described hereafter. In particular, the different control signals of the counter and of its decoding elements have not been detailed and are within the abilities of those skilled in the art based on the following description. Further, the practical implementation of a polysilicon resistor usable in a counting cell according to the present invention involves conventional techniques known of those skilled in the art.

A feature of the present invention is to provide counting cells, the memorization element of which is formed of a polysilicon resistor programmable by irreversible decrease in its value.

Figure 2:
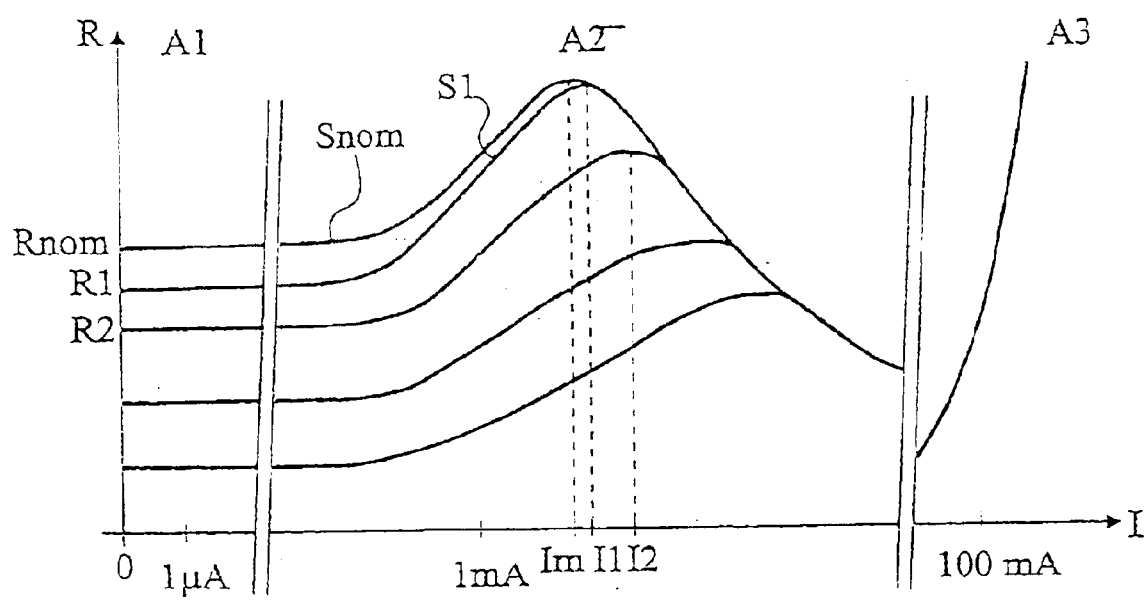
FIG. 2 illustrates, in a curve network, the programming of a cell such as illustrated in FIG. 1.

This feature of the present invention will better appear from the following discussion of FIGS. 1 and 2, which illustrates the programming possibilities of a polysilicon resistor exploited by the present invention.

FIG. 1 shows in a very simplified partial perspective view an example of a polysilicon resistor of the type used in a counting cell according to the present invention.

Such a resistor 1 is formed of a polysilicon track (also called a bar) obtained by etching of a layer deposited on an insulating substrate 2. Substrate 2 is indifferently formed of the integrated circuit substrate or is formed of an insulating layer forming an insulating substrate or the like for resistor 1. Resistor 1 is connected, by its two ends, to conductive tracks (for example, metal tracks) 3 and 4 intended to connect the resistive bar to the other integrated circuit elements according to the application. The simplified representation of FIG. 1 makes no reference to the different insulating and conductive layers generally forming the integrated circuit. To simplify, only resistive bar 1 laid on insulating substrate 2 and in contact, with the ends of its upper surface, with the two metal tracks 3 and 4, has been shown. In practice, the connections of resistive element 1 to the other integrated circuit components are obtained by wider polysilicon tracks starting from the ends of bar 1 in the alignment thereof. In other words, resistive element 1 is generally formed by making a section of a polysilicon track narrower than the rest of the track.

Resistance R of element 1 is given by the following formula:

$$R=\rho(L/s),$$

where ρ designates the resistivity of the material (polysilicon, possibly doped) forming the track in which element 1 is etched, where L designates the length of element 1, and where s designates its section, that is, its width 1 multiplied by its thickness e. Resistivity ρ of element 1 depends, among others, on the possible doping of the polysilicon forming it. In certain cases, the polysilicon element is covered with a metal layer, the resistive element then combining the polysilicon and the overlying metal.

Most often, upon forming of an integrated circuit, the resistors are provided by referring to a notion of so-called square resistance $R_\square$. This square resistance defines as being the resistivity of the material divided by the thickness with which it is deposited. Taking the above relation giving the resistance of an element 1, the resistance is thus given by the following relation:

$$R=R_\square * L/l.$$

Quotient L/l corresponds to what is called the number of squares forming resistive element 1. This represents, as seen from above, the number of squares of given dimension depending on the technology, put side by side to form element 1.

The value of the polysilicon resistance is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

In recent technologies, the use of polysilicon resistors is limited to resistors meant to conduct, in operation, currents smaller than 100 μA. For greater currents, a diffusion resistor is generally used. Polysilicon is however preferred to a dopant diffusion, since the occurrence of stray capacitances with the substrate is avoided.

To irreversibly decrease the value of a polysilicon resistor, a so-called constraint current is temporarily imposed for which the resistance switches through a maximum value, this current being beyond the normal operating current range of this resistance. In other words, the resistivity of the polysilicon in the operating current range is decreased, in stable and irreversible fashion, by imposing in the corresponding resistive element the flowing of a current beyond the operating current range.

The current used to decrease the resistance is, conversely to a fusible element, non-destructive for the polysilicon element.

FIG. 2 illustrates, with a curve network giving the resistance of a polysilicon element of the type shown in FIG. 1 according to the current flowing therethrough, the way of decreasing the resistance of this element.

It is assumed that the polysilicon used to manufacture resistive element 1 exhibits a nominal resistivity giving element 1, for the given dimensions 1, L, and e, a resistance $R_{nom}$. This nominal (original) value of the resistance corresponds to the value taken in a stable manner by resistive element 1 in the operating current range of the system, that is, generally, for currents smaller than 100 μA.

To decrease the resistance and to switch in an irreversible and stable manner, for example, to a value R1 smaller than $R_{nom}$, a so-called constraint current (for example, I1), greater than a current Im for which the value of resistance R of element 1 is maximum without for all this being infinite, is imposed across resistive element 1. As illustrated in FIG. 2, once current I1 has been applied to resistive element 1, a stable resistance of value R1 is obtained in range A1 of operating currents of the integrated circuit. In fact, curve $S_{nom}$ of the resistance according to the current is stable for relatively low currents (smaller than 100 μA). This curve starts increasing for substantially higher currents on the order of a few milliamperes, or even more (range A2). In this current range, curve $S_{nom}$ crosses a maximum for value Im. The resistance then progressively decreases. In FIG. 2, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the resistance or more specifically the resistivity of the polysilicon element.

Indeed, once the maximum of curve $S_{nom}$ of the resistivity according to the current has been passed, the value taken by the resistance in the operating current range is smaller than value $R_{nom}$. The new value, for example, R1, depends on the higher value of the current (here, I1) which has been applied during the irreversible current phase. It should indeed be noted that the irreversible decrease performed by the present invention occurs in a specific programming phase, outside of the normal read operating mode (range A1) of the integrated circuit, that is, outside of the normal resistor operation.

Once the value of the polysilicon resistor has been lowered to a lower value (for example, R1 in FIG. 2), an irreversible decrease in this value may further be implemented. It is enough, to achieve this, to exceed maximum current I1 of the new curve S1 of the resistance according to the current. For example, the value of the current may be increased to reach a value I2. When the current is then decreased again, a value R2 is obtained for the resistor in its normal operating range. The value of R2 is smaller than value R1 and, of course, than value $R_{nom}$.

It can be seen that all the curves of the resistance according to the current join on the decrease slope of the resistance value, after having crossed the maximum of the curve. Thus, for a given resistive element (ρ, L, s), currents I1, I2, etc. which must be reached, to switch to a smaller resistance value, are independent from the value of the resistance ($R_{nom}$, R1, R2) from which the decrease is caused.

What has been expressed hereabove as the resistance value actually corresponds to a decrease in the resistivity of the polysilicon forming the resistive element. The present inventors consider that the crystalline structure of the polysilicon is modified in a stable manner and that, in a way, the material is reflowed, the final crystalline structure obtained depending on the maximum current reached. In fact, the constraint current causes a temperature rise of the silicon element, which causes a flowing thereof.

Of course, it will be ascertained not to exceed programming current range A2 (on the order of a few milliamperes) to avoid destroying the polysilicon resistor. This precaution will pose no problem in practice since the use of polysilicon to form a fuse requires much higher currents (on the order of one tenth of an ampere) which are not available once the circuit has been made.

The practical forming of a polysilicon resistor according to the present invention does not differ from the forming of a conventional resistor. Starting from an insulating substrate, a polysilicon layer is deposited and etched according to the dimensions desired for the resistor. Since the deposited polysilicon thickness is generally determined by the technology, the two dimensions which can be adjusted are the width and the length. Generally, an insulator is redeposited on the polysilicon bar thus obtained. In the case of an on-line interconnection, width 1 will have been modified with respect to the wider access tracks to be more strongly conductive. In the case of an access to the ends of the bar from the top as shown in FIG. 1, vias will be made in the overlying insulator (not shown) of the polysilicon bar to connect contact metal tracks 3 and 4.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible doping of the polysilicon, whatever its type, does not hinder the implementation of the present invention. The only difference linked to the doping is the nominal resistivity before constraint and the resistivities obtained for given constraint currents. In other words, for an element of given dimensions, this conditions the starting point of the resistance value, and accordingly the resistance values obtained for given constraint currents.

To switch from the nominal value to a lower resistance or resistivity value, several methods may be used according to the present invention.

For example, the current is progressively (step by step) increased in the resistor. After each application of a higher current, it is returned to the operating current range and the resistance value is measured. As long as current point Im has not been reached, this resistance value will remain at value $R_{nom}$. As soon as current point Im has been exceeded, there is a curve change (curve S) and the measured value when back to the operating currents becomes a value smaller than value $R_{nom}$. If this new value is satisfactory, the process ends here. If not, higher currents are reapplied to exceed the new maximum value of the current curve. In this case, it is not necessary to start from the minimum currents again as when starting from the nominal resistance. Indeed, the value of the current for which the resistance will decrease again is necessarily greater than the value of constraint current I1 applied to pass onto the current curve. The determination of the pitch to be applied is within the abilities of those skilled in the art and is not critical in that it essentially conditions the number of possible decreases. The higher the pitch, the more the jumps between values will be high.

According to another preferred example, the different currents to be applied to pass from the different resistance values to smaller values are predetermined, for example, by measurements. This predetermination takes of course into account the nature of the polysilicon used as well as, preferentially, the square resistance, that is, the resistivity of the material and the thickness with which it is deposited. Indeed, since the curves illustrated by FIG. 2 may also be read as the curves of the square resistance, the calculated values may be transposed to the different resistors of an integrated circuit defined by widths and the lengths of the resistive sections. According to this second embodiment, the value of the constraint current to be applied to the resistive element to decrease its value in an irreversible and stable manner can then be predetermined.

The curve change, that is, the decrease in the resistance value in normal operation is almost immediate as soon as the corresponding constraint current is applied. "Almost immediate" means a duration of a few tens or even hundreds of microseconds which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, any additional duration of application of the constraint current does not modify, at least at the first order, the obtained resistance. Moreover, even if in a specific application, it is considered that the influence of the duration of application of the constraint cannot be neglected, the two methods are perfectly compatible with the taking into account of the duration of application of the constraint.

Figure 3:
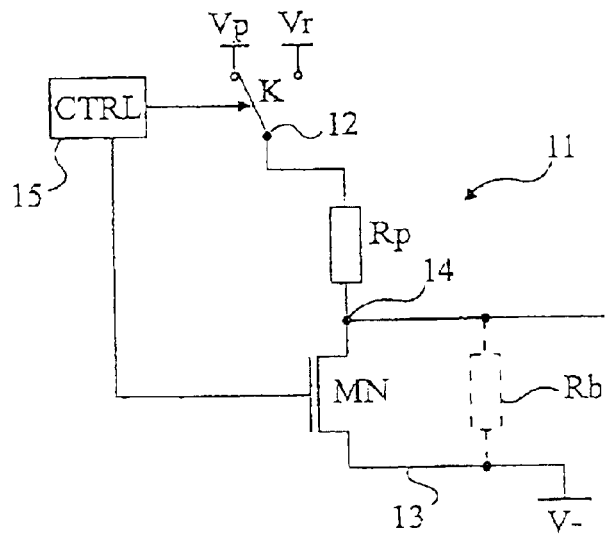
FIG. 3 shows a first embodiment of a counting cell according to the present invention.

FIG. 3 shows a first embodiment of a one-time programming counting cell (or memory cell) according to the present invention.

Cell 11 comprises, in series with a first terminal 12 of application of a positive supply voltage and a second terminal 13 of application of a more negative or reference supply voltage V⁻ (generally, the ground), a resistor Rp programmable by irreversible decrease in its value such as described hereabove in relation with FIGS. 1 and 2, and a programming switch, here, an N-channel MOS transistor (MN) Resistor Rp forms the storage element of cell 11. The state stored in the cell is read from junction point 14 of resistor Rp with transistor MN. The reading of the stored level is performed by comparison with a reference level.

To enable reading of the state stored in cell 11, a resistor Rb (shown in dotted lines in FIG. 3) is provided, which, when transistor MN is off, forms with resistor Rp a voltage-dividing bridge. Resistor Rb has been shown in dotted lines to illustrate its optionality. Indeed, it may be formed by transistor MN then biased in a linear portion of its characteristic and not in saturation.

Transistor MN, when on, short-circuits (at least functionally) fixed resistor Rb and is used to program resistor Rp by imposing the flowing of a current therethrough. The programming current of resistor Rp is greater than the current for which this resistance exhibits a maximum value determined as previously described in relation with FIGS. 1 and 2.

The nominal range of the operating currents of a polysilicon resistor used according to the present invention is smaller than some hundred microamperes and, most often, smaller than some ten microamperes. The amplitude of the programming currents is on the order of one milliampere.

The programming of a cell such as illustrated in FIG. 3 is made possible by providing selection of the positive supply voltage applied to terminal 12 between a read voltage Vr (adapted to generating a current on the order of one microampere) and a programming voltage Vp (adapted to generating a current on the order of one milliampere). The selection is performed by means of a switch K controlled by a control circuit 15 (CTRL) further providing the control signal adapted to transistor MN.

The counting operation comprises causing the irreversible decrease in the value of resistor Rp by applying a constraint current thereto. In read mode, the comparison of the voltage of a cathode with respect to a reference value enables determining whether the counting cell contains a state 0 or a state 1.

Figure 4:
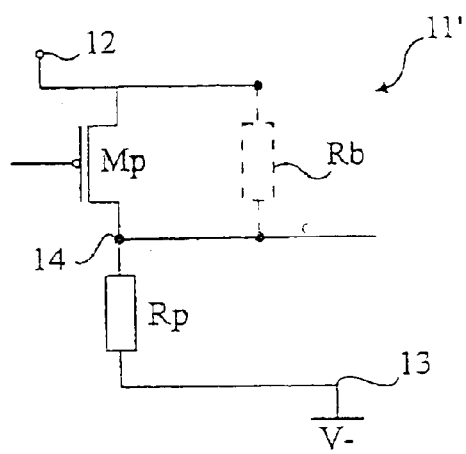
FIG. 4 shows a second embodiment of a counting cell according to the present invention.

FIG. 4 shows a second embodiment of a counting cell 11' according to the present invention. This cell differs from the cell of FIG. 3 by the fact that the used programming transistor MP is a P-channel MOS transistor. Transistor MP is connected between terminal 12 and read point 14. Programming resistor Rp is connected between point 14 and terminal 13 of application of the reference voltage. In FIG. 4, switch K and control circuit 15, although still present, have not been shown. Resistor Rb in dotted lines has been symbolized in parallel on transistor MP.

The operation of a cell 11' such as shown in FIG. 4 is similar to that of cell 11 of FIG. 3. The latter however forms a preferred embodiment due to the lesser bulk of the N-channel MOS transistor with respect to the P-channel MOS transistor.

Figure 5:
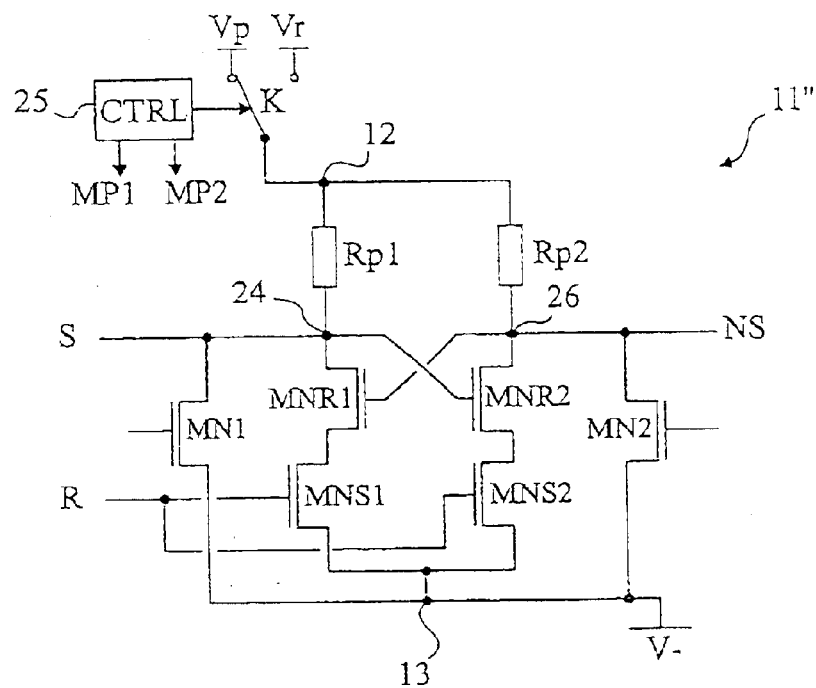
FIG. 5 shows a third embodiment of a counting cell according to the present invention.

FIG. 5 shows a third embodiment of a cell 11" of irreversible counting according to the present invention. The essential difference with respect to the counting cells shown in FIGS. 3 and 4 is that the structure of FIG. 5 is a differential structure which does not use a reference voltage to perform the comparison enabling detecting the state stored in the cell.

Cell 11" of FIG. 5 comprises two resistive branches in parallel between two supply terminals 12 and 13, two programming transistors MN1 and MN2 (in this example, N-channel MOS transistors), a control circuit 25 (CTRL), and a selector K between two supply voltages, respectively of reading Vr and programming Vp. The programming of a cell such as illustrated in FIG. 5 occurs similarly to that of the cells of FIGS. 3 and 4. What here changes is the cell structure enabling the reading.

In the embodiment of FIG. 5, a first so-called left-hand branch in the orientation of the drawing comprises in series a first resistor Rp1, a read MOS transistor MNR1, and a selection MOS transistor MNS1. The interconnection between resistor Rp1 and transistor MNR1 forms a first output terminal S arbitrarily called the direct output terminal (non-inverted). Terminal S also corresponds to point 24 of connection of resistor Rp1 to programming transistor MN1. A second so-called right-hand branch in the orientation of the drawing comprises, in series, a second resistor Rp2, a read MOS transistor MNR2, and a selection MOS transistor MNS2. The interconnection between resistor Rp2 and transistor MNR2 (and thus the drain of this transistor) forms a second inverse output terminal NS with respect to terminal S. Output NS also corresponds to point 26 of connection of resistor Rp2 to programming transistor MN2. The gate of transistor MNR2 is connected to terminal 24 while the gate of transistor MNR1 is connected to terminal 26 to obtain the effect of a bistable. The gates of transistors MNS1 and MNS2 are connected together to a terminal R intended to receive a read selection signal of the counting cell. This signal preferably corresponds to the counting cell selection signal in a unidirectional arrangement of several cells. It is then provided by the adapted column or line decoder. In the example shown, all transistors have N channels.

The read operation of a cell according to this embodiment is the following. Circuit 25 causes the switching of selector K to voltage Vr. Preferably, this is its quiescent state since the other state is only used in programming (and thus, in principle, only once per cell). Input terminal R receives the cell selection (or read configuration) signal (active in the high state), turning on the two transistors MNS1 and MNS2.

As a result, one of the MNS terminals sees its voltage increase faster than the other. This imbalance comes from the value difference between resistors Rp1 and Rp2. It causes the conduction of one of transistors MNR1 and MNR2. Due to the crossing of the gates of this transistor, that which conducts first is that having a gate taking part in the electric path (from terminal 12) having the shortest time constant (the resistor having the smallest value generates a shorter time constant), and thus that having a drain voltage increasing slower than the other. Once on, this MNR transistor forces its drain (and thus the corresponding output terminal S or NS) to ground 13, which confirms the off state of the MNR transistor of the other branch, and thus the high state on the corresponding output terminal.

The programming of a cell according to this embodiment is performed in the same way as for the first two embodiments, by means of one of transistors MN1 and MN2. However, transistors MNS1 and MNS2 of the counting cell must be off upon programming (input R low). They are used to protect read transistors MNR1 and MNR2 by making their sources float, thus avoiding the occurrence of destructive gate-source voltages due to supply voltage Vp. Further, by disconnecting the MNR transistors by their sources, the MNS transistors prevent them from seeing, between their drain and source, high voltage Vp. Accordingly, the MNR and MNS transistors can be sized according to read voltage Vr. Only programming transistors MN need sizing to hold voltage Vp and stand the relatively high current (as compared to the read operating range) used to program the cell.

Like for the embodiment of FIG. 3, that of FIG. 5 also applies to P-channel MOS transistors. The transposing of the embodiment of FIG. 5 to P-channel MOS transistors is within the abilities of those skilled in the art.

According to an alternative embodiment, it is possible to use a single supply voltage for the counting cell. The selection of the supply voltage between levels Vp and Vr is thus avoided. In this case, a sufficient supply voltage to impose the desired constraint to the programming of resistors Rp1 and Rp2 (FIG. 5), or of resistors Rp (FIGS. 3 and 4) is chosen. The transistor dimensions are then chosen accordingly.

FIG. 6 shows an embodiment of a counter 30 of k+1 cells 11 of the type illustrated in relation with FIGS. 3 to 5. Each counting cell has a state 0 or 1.

In a direct reading of the result of a counter of FIG. 6, each bit can take a state 0 or 1. However, once a counting cell has been programmed in a state 1, the fact for its programming to be irreversible results in that the counting cannot be linear when the outputs of counter 30 are directly exploited.

FIG. 7 shows a preferred embodiment of an increasing linear monotonous counter according to the present invention.

A feature of the present invention is to associate, with one-time programming memory cells such as described hereabove, a parity calculator 40 virtually enabling obtaining states 0 even after programming of states 1.

The example of FIG. 7 relates to a counter over three bits comprised of eleven one-time programming cells of the type described in relation with FIGS. 3 to 5. These cells are distributed in three groups or lines A3, A2, and A1 representing the counter bits. For a three-bit counter, line A3 corresponding to the least significant bit comprises seven cells associated with a parity calculator PA3. Line A2 corresponding to a bit of intermediary significance comprises three cells associated with a parity calculator PA2. Line A1 corresponding to the most significant bit includes a single cell (preferably associated with a parity calculator PA1 for reasons of structure regularity). The result of the counter, that is, states B1, B2, and B3, is provided by parity calculators 40 respectively representing the most significant, intermediary, and least significant bits.

According to the present invention, each time the counter is to be incremented, the counting cells are addressed in specific manner according to the size of the counter to obtain the desired parity calculation providing a linear count.

FIG. 8 illustrates, in a table 42, the successive states taken by the linear counter of FIG. 7 and will be described in relation with an example of addressing of the counting cells of FIG. 7.

It is assumed that all cells 11 of FIG. 7 initially are at state zero. The parity calculators thus also contain zero values (first line of table 42).

The counting is performed by starting with filling line A3 from left to right in the orientation of FIG. 7. The first state thus is 001, only parity counter PA3 providing a state 1. According to the present invention, at each passing on an even unit decoded by a parity counter 40, one of the counting cells of the next line is incremented. Thus, when a state 1 is programmed in a second cell of line A3, calculator PA3 provides a parity at zero, which triggers the programming to state 1 of one of the cells of line A2. The parity calculation performed by calculator PA2 then provides a 1 while calculator PA3 provides a zero (third line of table 42). This counting operation carries on until all parity counters provide a state 1. The successive shiftings from one line to the other by the addressing in counting mode have been illustrated by arrows in dotted lines in FIG. 7.

The programming of a counting cell of a line of higher rank at the same time as the cell of lower rank may be performed, either from a state machine in wired logic, or from a microcontroller.

According to the present invention, it is the programming addressing function which conditions the output states of the counter. This programming state may, if desired, vary according to the real time counting, for example, to keep track of the variation of a phenomenon where each programmed counting cell would correspond to the occurrence of an event. For example, a history of electric keying operations, trials, etc. may thus be followed, or a one-way recorder may be formed.

A univocal sequencing function of the counter cell programming in wired logic may also be provided. For example, to have as an output, in a given programming step, a single word used for example as an evolutive key for the unlocking of a specific function (for example, a cyphering algorithm in an application to subscriber television).

Of course, although the counting cells have been shown in three separate lines in FIG. 7 to clarify the discussion thereof, they may in practice be formed as a matrix arrangement, the addressing functions corresponding to the count programming functions desired according to the results given by the parity calculators.

More generally, to obtain a counter over n bits, the number of necessary counting cells is $2^{n+1}-(n+2)$.

The cell distributions (number of cells per line), referring to the embodiment of FIG. 7 are for p (ranging between 1 and n) representing the rank of the parity decoder, $2^p-1$.

It can thus be seen that all lines have an odd number of counting cells.

FIG. 9 shows an example of a parity calculator for five cells C1 to C5. The respective outputs of cells C1 to C4 are combined two by two with XOR-type gates 45 and 46 having respective outputs once again combined by an XOR gate 47. The output of gate 47 is combined with the output of cell C5 by an XOR gate 48 providing parity PA of the five concerned cells.

An advantage of the present invention is that it enables forming an increasing linear monotonous counter, without for the content of this counter to be observable.

Another advantage of the present invention is that its implementation is compatible with a standard CMOS technology, that is, the present invention is applicable to all circuits without requiring an embarked EEPROM.

Another advantage of the present invention is that the present invention is compatible with a wired logic implementation and that it can operate without a clock.

Another advantage of the present invention, which is particularly advantageous in a security application, is that for the case where a possible pirate performs a programming of any one of the cells, either the cell has already been programmed, and this makes no change for the counter, or the cell was not in a programmed state and the number of residual programming trials is limited.

Of course, the present invention is likely to have various alterations, modifications, and improvements which will readily occur to those skilled in the art. In particular, the implementation of the programming, that is, counting, addressing function is within the abilities of those skilled in the art based on the functional indications given hereabove and on the application.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An increasing monotonic counter over n bits formed as an integrated circuit, comprising:
    an assembly of $2^{n+1}-(n+2)$ irreversible counting cells distributed in at least n groups of $2^p-1$ counting cells, where p designates a group rank; and
    at least n−1 parity calculators, each calculator providing a bit of rank p, increasing from a most significant bit of a result count, taking into account states of the cells counting of the group of same rank.

2. The counter of claim 1, wherein the most significant bit is directly provided by a single cell of a group of rank P=1.

3. The counter of claim 1, comprising n calculators, the most significant bit being provided by a calculator taking into account the state of a single counting cell of the group of rank P=1.

4. The counter of claim 1, wherein each counting cell is formed of a one-time programming memory cell, a storage element of which is formed of at least one polysilicon resistor, programmable by irreversible decrease in its value.

5. A method for controlling an increasing monotonic counter over n bits formed as the integrated circuit including an assembly of $2^{n+1}-(n+2)$ irreversible counting cells distributed in at least n groups of $2^p-1$ counting cells, where p designates a group rank, and at least n−1 parity calculators, each calculator providing a bit of rank p, increasing from a most significant bit of a result count, taking into account states of the cells counting of the group of same rank, the method comprising causing a programming of a counting cell of a group of lower rank each time the parity calculator of a group of immediately higher rank detects a parity.

6. The method of claim 5, implemented by a state machine in wired logic.

7. The method of claim 5, implemented by a microcontroller.

* * * * *